(12) United States Patent
Yoshida et al.

(10) Patent No.: US 7,982,531 B2
(45) Date of Patent: Jul. 19, 2011

(54) REFERENCE VOLTAGE GENERATING CIRCUIT AND POWER SUPPLY DEVICE USING THE SAME

(75) Inventors: Masaaki Yoshida, Hyogo (JP); Hiroaki Nakanishi, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 295 days.

(21) Appl. No.: 11/915,440

(22) PCT Filed: Mar. 20, 2007

(86) PCT No.: PCT/JP2007/056534
§ 371 (c)(1),
(2), (4) Date: Nov. 26, 2007

(87) PCT Pub. No.: WO2007/116780
PCT Pub. Date: Oct. 18, 2007

(65) Prior Publication Data
US 2009/0146731 A1   Jun. 11, 2009

(30) Foreign Application Priority Data

Mar. 31, 2006 (JP) .................................. 2006-096672
Nov. 7, 2006 (JP) .................................. 2006-301070

(51) Int. Cl.
*G05F 3/24* (2006.01)
*H01L 27/088* (2006.01)
(52) U.S. Cl. .................. 327/543; 327/541; 323/313

(58) Field of Classification Search .................. None
See application file for complete search history.

(56) References Cited

U.S. PATENT DOCUMENTS

| 4,400,799 | A | * | 8/1983 | Gudger | 365/185.08 |
|---|---|---|---|---|---|
| 5,339,272 | A | * | 8/1994 | Tedrow et al. | 365/189.09 |
| 5,831,901 | A | * | 11/1998 | Tang et al. | 365/185.03 |
| 6,185,133 | B1 | * | 2/2001 | Chan et al. | 365/185.29 |
| 6,215,352 | B1 | * | 4/2001 | Sudo | 327/530 |
| 6,396,739 | B2 | * | 5/2002 | Briner | 365/185.2 |
| 6,552,603 | B2 | * | 4/2003 | Ueda | 327/541 |
| 6,559,710 | B2 | * | 5/2003 | Matsuoka | 327/537 |
| 6,798,278 | B2 | * | 9/2004 | Ueda | 327/541 |
| 7,149,123 | B2 | * | 12/2006 | Georgescu et al. | 365/185.03 |
| 7,538,378 | B2 | * | 5/2009 | Jung | 257/316 |

FOREIGN PATENT DOCUMENTS

| JP | 4-65546 | 10/1992 |
|---|---|---|
| JP | 5-119859 | 5/1993 |
| JP | 2002-6968 | 1/2002 |
| JP | 2002-110917 | 4/2002 |
| JP | 2002-368107 | 12/2002 |

\* cited by examiner

*Primary Examiner* — Lincoln Donovan
*Assistant Examiner* — Terry L Englund
(74) *Attorney, Agent, or Firm* — Cooper & Dunham LLP

(57) ABSTRACT

A reference voltage generating circuit for generating a reference voltage includes MOSFETs connected to each other. At least one of the MOSFETs includes a control gate and a floating gate that is made hole-rich or discharged by ultraviolet irradiation, and the reference voltage generating circuit is configured to output the difference between threshold voltages of a pair of the MOSFETs as the reference voltage.

3 Claims, 11 Drawing Sheets

REFERENCE VOLTAGE GENERATING CIRCUIT AND POWER SUPPLY DEVICE USING THE SAME

TECHNICAL FIELD

The present invention generally relates to a reference voltage generating circuit of a MOS type, CMOS type, or operational-amplifier type used alone or as a part of another semiconductor device, and a device such as a power supply device including the reference voltage generating circuit.

BACKGROUND ART

A known conventional reference voltage generating circuit uses, as the constant current source, a depletion-mode metal-oxide semiconductor field-effect transistor (MOSFET) in which the gate and the source are connected (see, for example, patent document 1). In such a reference voltage generating circuit, as shown in FIG. 11A, the gate and the source of a depletion-mode MOSFET Q21 are connected so that it functions as a constant current source. An enhancement-mode MOSFET Q22, in which the gate and the drain are connected, is connected in series with the depletion-mode MOSFET Q21 so that it operates with a constant current supplied from the depletion-mode MOSFET Q21, and a voltage appearing at the enhancement-mode MOSFET Q22 is output as a reference voltage Vref. The depletion-mode MOSFET Q21 and the enhancement-mode MOSFET Q22 are both N-channel MOSFETS. The reference voltage Vref equals the difference between a threshold voltage Vt_d of the depletion-mode MOSFET Q21 and a threshold voltage Vt_e of the enhancement-mode MOSFET Q22.

FIG. 11B is a graph showing the relationship between Vgs and $(Ids)^{1/2}$ of the depletion-mode MOSFET Q21 and the enhancement-mode MOSFET Q22 (Vgs indicates a voltage between the gate and the source, and Ids indicates a drain current). In FIG. 11B, it is assumed that the drain voltage is in the saturation region and the conductance factors (K) of the depletion-mode MOSFET Q21 and the enhancement-mode MOSFET Q22 are the same.

Since Vgs of the depletion-mode MOSFET Q21 is fixed at 0 V, the depletion-mode MOSFET Q21 conducts a constant current Iconst. Therefore, Vref is a Vgs of the enhancement-mode MOSFET Q22 at which Ids equals Iconst (Ids=Iconst) and can be obtained by the formula Vref=Vt_e−Vt_d.

Thus, Vref is obtained as the difference between the threshold voltage Vt_e of the enhancement-mode MOSFET Q22 and the threshold voltage Vt_d of the depletion-mode MOSFET Q21. Since the threshold-voltage Vt_d of the depletion-mode MOSFET Q21 is a negative value, the above formula can also be expressed as Vref=|Vt_1|+|Vt_d|.

FIG. 12A shows another exemplary reference voltage generating circuit. The exemplary reference voltage generating circuit is a 3-transistor reference voltage generating circuit including a depletion-mode MOSFET Q23 and two enhancement-mode MOSFETs Q24 and Q25 having different threshold voltages. The depletion-mode MOSFET Q23 is a constant current source where the gate and the source are connected as in the case of the depletion-mode MOSFET Q21 shown in FIG. 11A. A threshold voltage Vt_el of the enhancement-mode MOSFET Q24 is lower than a threshold voltage Vt_eh of the enhancement-mode MOSFET Q25. The difference between the threshold voltage Vt_el and the threshold voltage Vt_eh is output as the reference voltage Vref.

FIG. 12B is a graph showing the relationship between Vgs and $(Ids)^{1/2}$ of the depletion-mode MOSFET Q23 and the enhancement-mode MOSFETs Q24 and Q25. In FIG. 12B, it is assumed that the drain voltage is in the saturation region and the conductance factors (K) of the depletion-mode MOSFET Q23 and the enhancement-mode MOSFETs Q24 and Q25 are the same. Since Vgs of the depletion-mode MOSFET Q23 is fixed at 0 V, the depletion-mode MOSFET Q23 conducts a constant current Iconst as shown in FIG. 12B. Vo24 is a Vgs of the enhancement-mode MOSFET Q24 when Ids=Iconst and Vo25 is a Vgs of the enhancement-mode MOSFET Q25 when Ids=Iconst. Vref is the difference between Vo25 and Vo24: Vref=Vo25−Vo24. In other words, Vref can be expressed by the formula Vref=Vt_eh−Vt_el.

As another example, there is a reference voltage generating circuit including MOSFETs each having a floating gate and a control gate (see, for example, patent document 2). In a reference voltage generating circuit disclosed in patent document 2, two N-channel MOSFETs are connected in series. One of the two N-channel MOSFETs is configured as a depletion-mode MOSFET by injecting holes into the floating gate. The other one of the two N-channel MOSFETs is configured as an enhancement-mode MOSFET by injecting electrons into the floating gate. Thus, the two N-channel MOSFETs are configured to have different threshold voltages.

Also, there is an operational-amplifier type reference voltage generating circuit including MOSFETs one of which has a floating gate and a control gate (see, for example, patent document 3). A reference voltage generating circuit disclosed in patent document 3 is implemented as an operational amplifier including a differential input stage made up of a pair of MOSFETs in which operational amplifier an output terminal is connected to a negative input terminal. One of the pair of MOSFETs includes a floating gate and a control gate. The threshold voltages of the pair of MOSFETs are made different by injecting electric charges into the floating gate of one of the pair of MOSFETs. Thus, the disclosed reference voltage generating circuit is configured to output the difference between the threshold voltages of the pair of MOSFETs as an offset voltage.

[Patent document 1] Japanese Patent Publication No. 4-65546

[Patent document 2] Japanese Patent Application Publication No. 2002-368107

[Patent document 3] Japanese Patent Application Publication No. 5-119859

A disadvantage of a conventional reference voltage generating circuit including MOSFETs, each or one of which includes a floating gate and a control gate, is that the threshold voltages of the MOSFETs change over time in accordance with the decrease (discharge) or increase of electric charges in the floating gate. This, in turn, causes the output voltage from the conventional reference voltage generating circuit to change.

Also, with a conventional method where the threshold voltages of MOSFETs are determined by the channel doping levels, the impurity profiles of channels (hereafter called channel profiles) of the MOSFETs become different. As a result, temperature characteristics of the threshold voltages and mobility of the MOSFETs also become slightly different. Therefore, such a conventional method has limitations in terms of improving the temperature characteristics of a reference voltage to be output.

SUMMARY

In an aspect of this disclosure, there is provided a reference voltage generating circuit and a power supply device including the reference voltage generating circuit, configured to reduce the change over time in the threshold voltages of MOSFETs of the reference voltage generating circuit and thereby to reduce the change over time in the reference voltage to be output from the reference voltage generating circuit.

According to an embodiment, a reference voltage generating circuit for generating a reference voltage includes MOSFETs connected to each other; wherein at least one of the MOSFETs includes a control gate and a floating gate that is made hole-rich or discharged by ultraviolet irradiation; and the reference voltage generating circuit is configured to output the difference between threshold voltages of a pair of the MOSFETs as the reference voltage.

BEST MODE FOR CARRYING OUT THE INVENTION

Preferred embodiments of the present invention are described below with reference to the accompanying drawings.

In DESCRIPTION and CLAIMS of the present application, a term "hole-rich" or "hole-rich state" indicates a state where holes are injected into a floating gate and is used in contrast to where no electric charge is present in the floating gate (the floating gate is discharged by ultraviolet irradiation). Also, a term "electron-rich" or "electron-rich state" indicates a state where electrons are injected into a floating gate and is used in contrast to where no electric charge is present in the floating gate (the floating gate is discharged by ultraviolet irradiation).

The present inventors have discovered that the retention characteristics (charge retention characteristics) of a MOSFET are better when the floating gate is hole-rich than when the floating gate is electron-rich.

Figure 1:
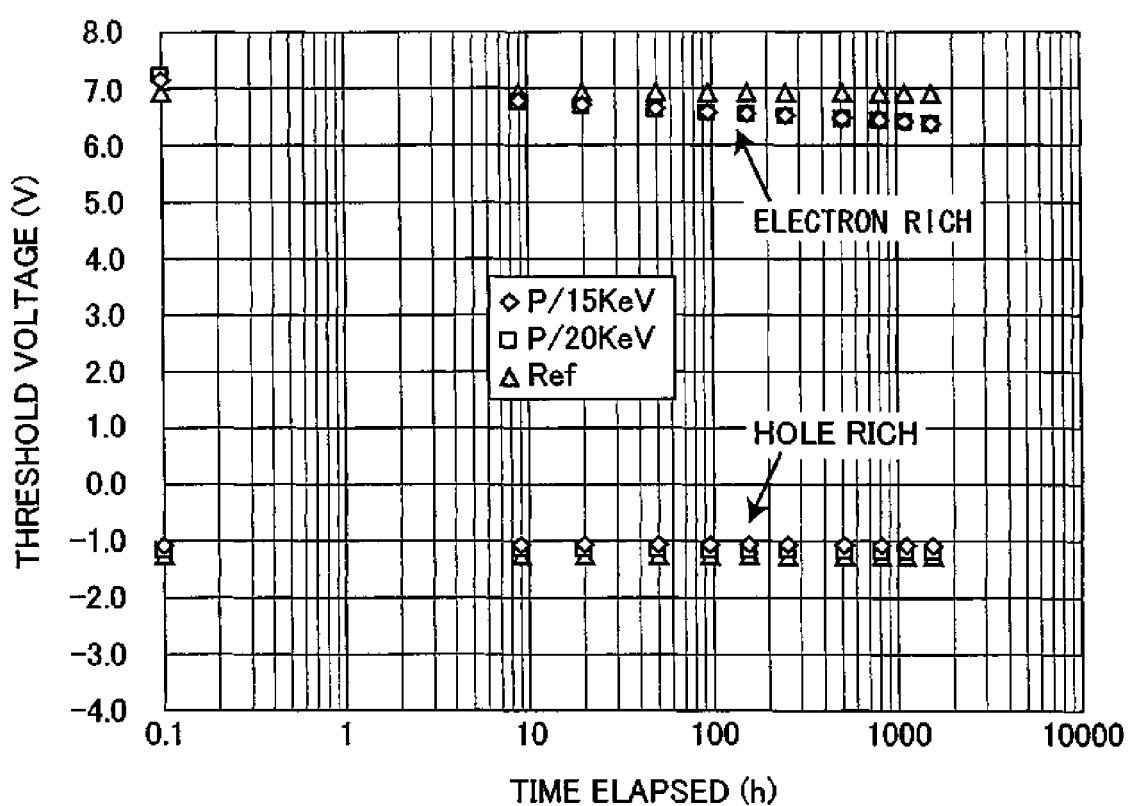
FIG. 1 is a graph showing exemplary retention characteristics of MOSFETs each including a floating gate.

FIG. 1 is a graph showing exemplary results of measuring the retention characteristics of MOSFETs each including a floating gate. The vertical axis indicates threshold voltages (in volts) and the horizontal axis indicates time elapsed (in hours). In the measurement, N-channel MOSFETs were used. The initial threshold voltage, which is the threshold voltage when there is no electric charge in the floating gate (after the floating gate is discharged by ultraviolet irradiation), of the N-channel MOSFETs was 0 V. Two MOSFETs indicated by ◇ were prepared by doping the floating gates by phosphorus (P) ion implantation at 15 KeV. One of the MOSFETs ◇ was made hole-rich by injecting holes (removing electrons) (threshold voltage is around −1.0 V) and the other one was made electron-rich by injecting electrons (threshold voltage is around 7.0 V). Two MOSFETs indicated by □ were prepared by doping the floating gates by phosphorus (P) ion implantation at 20 KeV. One of the MOSFETs □ was made hole-rich (threshold voltage is around −1.0 V) and the other one was made electron-rich (threshold voltage is around 7.0 V). After injecting electric charges, the four MOSFETs were heated at 250° C. Also, two MOSFETs indicated by Ref and used as comparative examples were prepared in a similar manner (the floating gates were doped by phosphorus (P) ion implantation at 15 KeV) as MOSFETs ◇ except that they were not heated.

As shown in FIG. 1, since the MOSFETs Ref were not heat processed, their threshold voltages do not fluctuate much. The retention characteristics of the MOSFETs (◇, □) with hole-rich floating gates were substantially the same as those of the MOSFETs Ref and were better than those of the MOSFETs (◇, □) with electron-rich floating gates.

In another experiment, 512 MOSFETs having substantially the same structure were arranged in an array of 32 rows and 16 columns. The floating gates of all of the 512 MOSFETs were made hole-rich. At this stage, the threshold voltages of the MOSFETs were set at a predetermined value. After heating the MOSFETs (at 250° C., for 24 hours), the threshold voltages of the MOSFETs were measured and a standard deviation a of differences between the measured threshold voltages of adjacent pairs of the MOSFETs were obtained. The average initial threshold voltage of the MOSFETs was −0.3 V and the threshold voltage of the MOSFETs after injecting holes was −2.0 V. This experiment was performed three times and the obtained standard deviations σ were 1.0 mV, 1.6 mV, and 2.2 mV, respectively.

Figure 2A:
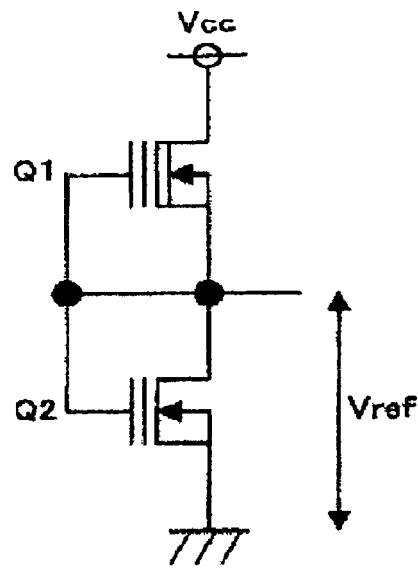
FIG. 2A is a circuit diagram illustrating a first exemplary reference voltage generating circuit according to an embodiment of the present invention.
Figure 2B:
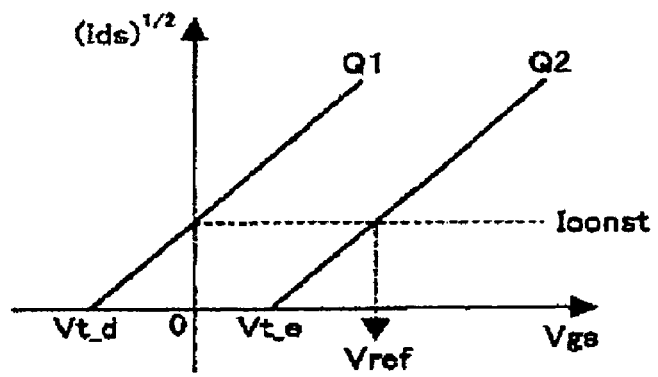
FIG. 2B is a graph showing the relationship between Vgs and $(Ids)^{1/2}$ of MOSFETs in the first exemplary reference voltage generating circuit.

FIG. 2A is a circuit diagram illustrating a first exemplary reference voltage generating circuit according to an embodiment of the present invention. FIG. 2B is a graph showing the relationship between Vgs and (Ids)$^{1/2}$ of MOSFETs in the first exemplary reference voltage generating circuit (on the assumption that the drain voltage is in the saturation region).

Q1 and Q2 in FIGS. 2A and 2B indicate N-channel MOSFETs each having a floating gate and a control gate. The MOSFETs Q1 and Q2 have substantially the same structure and substantially the same channel profile. This means either channel doping is not performed on the MOSFETs Q1 and Q2 (the channel doping level is 0), or the channel doping levels of the MOSFETs Q1 and Q2 are substantially the same. The MOSFETs Q1 and Q2 have an enhancement-mode threshold voltage of, for example, 1.0 V as the initial threshold voltage (the threshold voltage after the floating gates are discharged by ultraviolet irradiation).

The MOSFET Q1 is configured as a depletion-mode MOSFET with a threshold voltage of −0.3 V by injecting holes into the floating gate. The gate and the source of the MOSFET Q1 are connected.

The MOSFET Q2 is configured as an enhancement-mode MOSFET with a threshold voltage of 0.8 V by injecting holes into the floating gate. The number of holes injected into the floating gate of the MOSFET Q2 is fewer than that injected into the floating gate of the MOSFET Q1. The gate and the drain of the MOSFET Q2 are connected.

The drain of the MOSFET Q1 is connected to a power supply (Vcc), the source of the MOSFET Q2 is grounded, and the drain of the MOSFET Q2 is connected to the source of the MOSFET Q1. In other words, the MOSFETs Q1 and Q2 are connected in series between a power supply potential and ground potential. With this configuration, the MOSFET Q2 operates with a constant current from the MOSFET Q1 and a voltage appearing at the MOSFET Q2 is output as a reference voltage.

FIG. 2B shows the relationship between Vgs and (Ids)$^{1/2}$ of the MOSFETs Q1 and Q2. Since Vgs of the MOSFET Q1 is fixed at 0 V, the MOSFET Q1 conducts a constant current Iconst. Therefore, the reference voltage Vref is a Vgs of the MOSFET Q2 at which Ids equals Iconst (Ids=Iconst).

As described above, according to this embodiment, the floating gates of the MOSFETs Q1 and Q2 are made hole-rich. This configuration makes it possible to improve the retention characteristics (charge retention characteristics) of the MOSFETs Q1 and Q2 and thereby to reduce the change over time in the threshold voltages of the MOSFETs Q1 and Q2. This, in turn, makes it possible to reduce the change over time in the reference voltage Vref to be output.

Also, according to this embodiment, each of the MOSFETs Q1 and Q2 includes a floating gate and a control gate. This configuration makes it possible to determine the threshold voltages of the MOSFETs Q1 and Q2 by injecting holes into the floating gates and thereby to obtain a desired reference voltage Vref. In other words, this embodiment eliminates the need to determine the threshold voltage of a MOSFET by ion implantation during wafer processing as in the case of a conventional technology.

Further, this embodiment makes it possible to make the configurations, including the channel profiles, of the MOSFET Q1 and Q2 substantially the same. This, in turn, reduces wafer processing variations and the variation in temperature characteristics of MOSFETs and thereby makes it possible to provide a reference voltage generating circuit that can output a stable reference voltage.

Although the floating gates of both of the MOSFETs Q1 and Q2 are made hole-rich in the above embodiment, the floating gate of the enhancement-mode MOSFET Q2 may be discharged by ultraviolet irradiation.

Figure 3A:
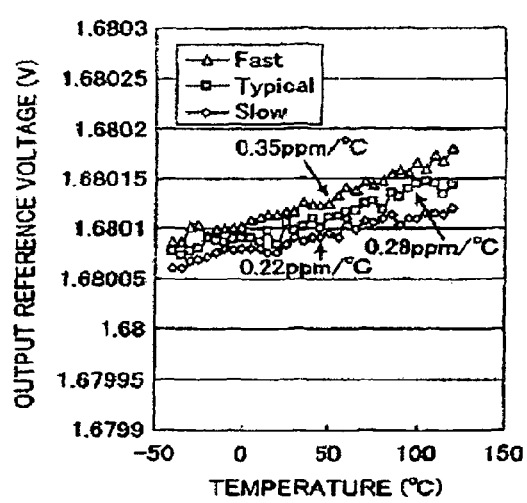
FIGS. 3A through 3E are graphs showing temperature dependence of reference voltages Vref output from an exemplary reference voltage generating circuit according to an embodiment of the present invention and a conventional reference voltage generating circuit.
Figure 3B:
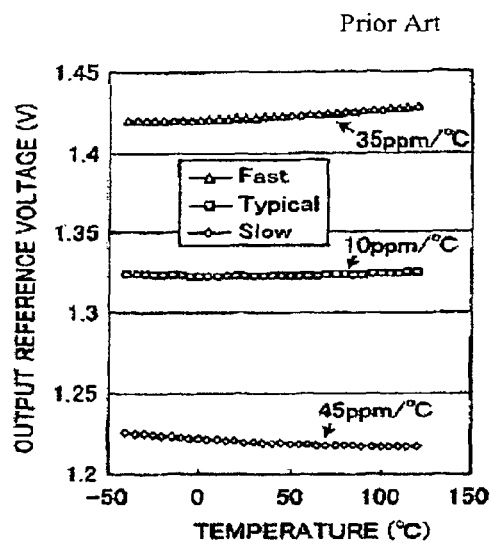
Figure 3C:
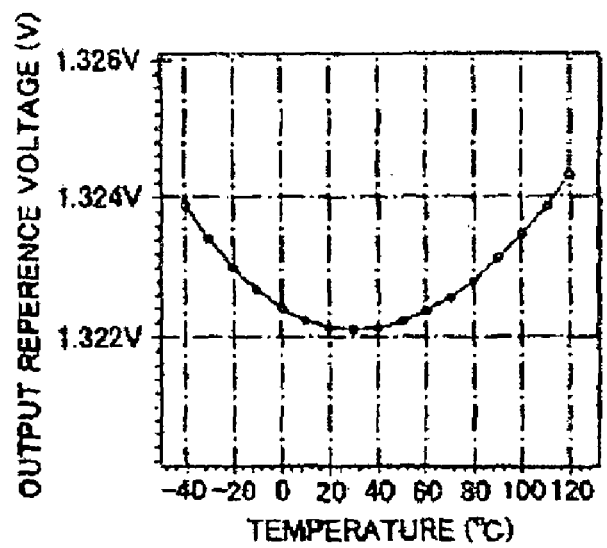
Figure 3D:
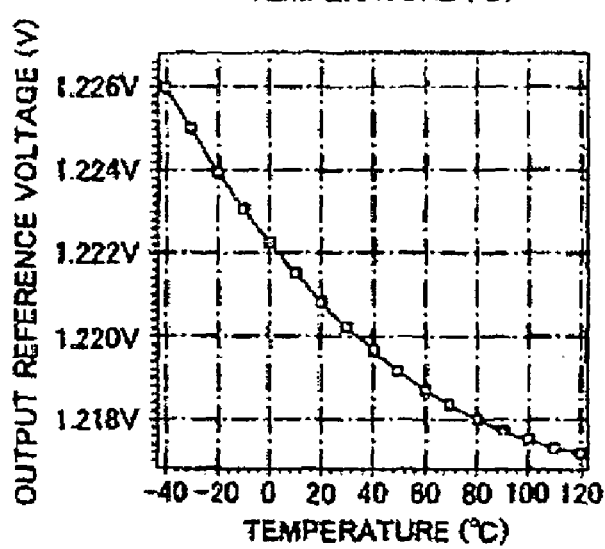
Figure 3E:
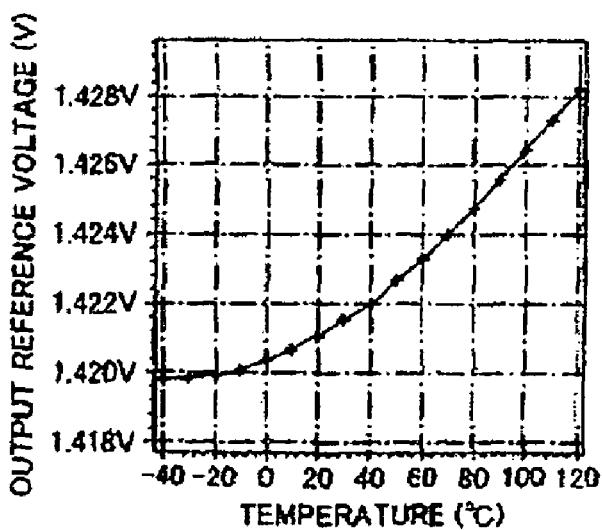
Figure 5A:
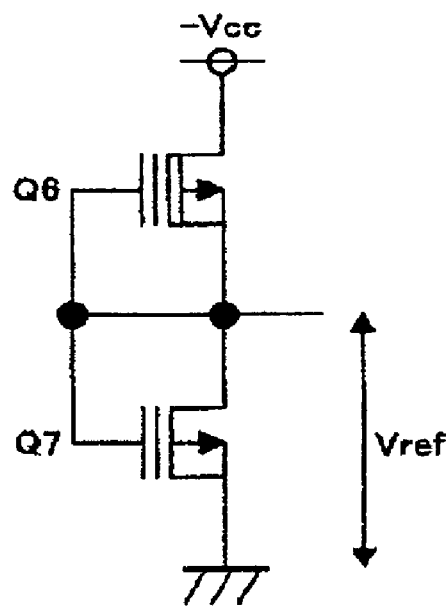
FIG. 5A is a circuit diagram illustrating a third exemplary reference voltage generating circuit according to another embodiment of the present invention.

FIGS. 3A through 3E are graphs showing temperature dependence of reference voltages Vref output from an exemplary reference voltage generating circuit according to an embodiment of the present invention and a conventional reference voltage generating circuit. In FIGS. 3A through 3E, the vertical axis indicates output reference voltages (V), the horizontal axis indicates temperatures (° C.), Typical indicates a typical fluctuation, Fast indicates an upper maximum fluctuation, and Slow indicates a lower maximum fluctuation. FIG. 5A shows the temperature dependence of the output reference voltage Vref of the exemplary reference voltage generating circuit; FIG. 3B shows that of a conventional reference voltage generating circuit; FIG. 3C shows Typical in FIG. 3B in more detail; FIG. 3D shows Slow in FIG. 3B in more detail; and FIG. 3E shows Fast in FIG. 3B in more detail.

The configuration of the exemplary reference voltage generating circuit used in the measurement shown in FIG. 3A was substantially the same as that shown in FIG. 2. The channel length of two N-channel MOSFETs used in the exemplary reference voltage generating circuit was 300 μm, the channel width was 20 μm, and the initial threshold voltage was 0.8 V. One of the N-channel MOSFETs was configured as a depletion-mode MOSFET with a threshold voltage of −0.88 V and the other one was configured as an enhancement-mode MOSFET with a threshold voltage of 0.8 V by injecting holes into the floating gates. Thus, the exemplary reference voltage generating circuit was configured to output a reference voltage Vref of 1.68 V at 25° C.

Figure 11A:
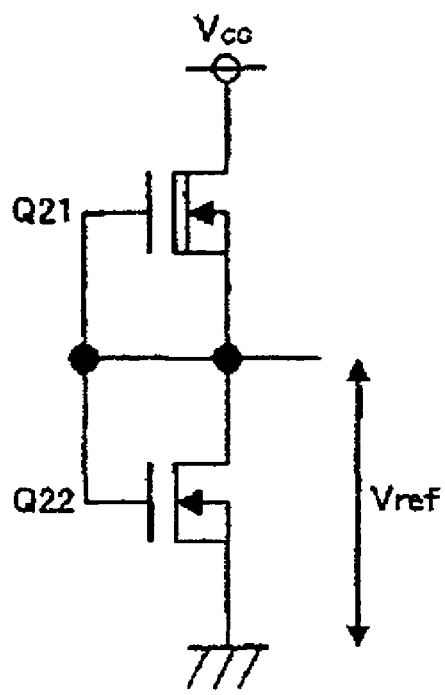
FIG. 11A is a circuit diagram illustrating a conventional reference voltage generating circuit.
Figure 11B:
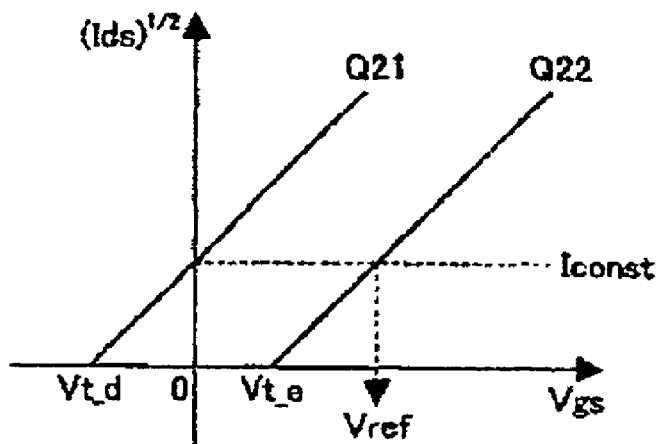
FIG. 11B is a graph showing the relationship between Vgs and $(Ids)^{1/2}$ of MOSFETs in the conventional exemplary reference voltage generating circuit.
Figure 12A:
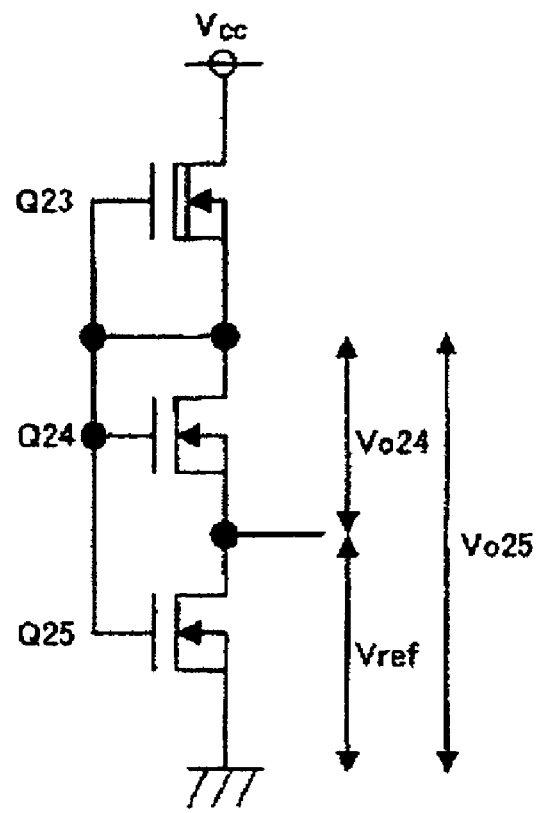
FIG. 12A is a circuit diagram illustrating another conventional reference voltage generating circuit.
Figure 12B:
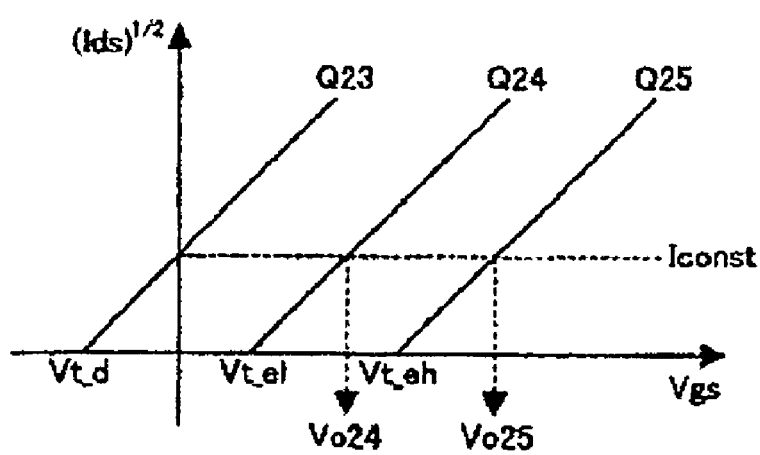
FIG. 12B is a graph showing the relationship between Vgs and $(Ids)^{1/2}$ of MOSFETs in the another conventional reference voltage generating circuit.

The configuration of the conventional reference voltage generating circuit used in the measurement shown in FIG. 3B was substantially the same as that shown in FIG. 11A. Two N-channel MOSFETs, a depletion-mode MOSFET and an enhancement-mode MOSFET, were used in the conventional reference voltage generating circuit. The channel length of the depletion-mode MOSFET was 200 μm, the channel width was 20 μm, and the threshold voltage was −0.5 V. The channel length of the enhancement-mode MOSFET was 65.4 μm, the channel width was 20 μm, and the threshold voltage was 0.8 V. Thus, the conventional reference voltage generating circuit was configured to output a reference voltage Vref of 1.3 V at 25° C.

With the exemplary reference voltage generating circuit, as shown in FIG. 3A, the temperature dependence of Typical was 0.28 ppm (parts per million)/° C., that of Fast was 0.35 ppm/° C., and that of Slow was 0.22 ppm/° C.

With the conventional reference voltage generating circuit, as shown in FIGS. 3B through 3D, the temperature dependence of Typical was 10 ppm/° C., that of Fast was 35 ppm/° C., and that of Slow was 45 ppm/° C.

As the results show, a reference voltage generating circuit including MOSFETs having hole-rich floating gates can output a stable reference voltage without being much influenced by temperature change.

In the above embodiment, each of the MOSFETs Q1 and Q2 includes a floating gate. However, a configuration where only one of two MOSFETs includes a floating gate is also possible. In this case, the floating gate in one of the two MOSFETs is made hole-rich. For example, the one of the two MOSFETs may be a depletion-mode N-channel MOSFET having a threshold voltage that is attained by lowering a depletion-mode initial threshold voltage by injecting holes.

Figure 4A:
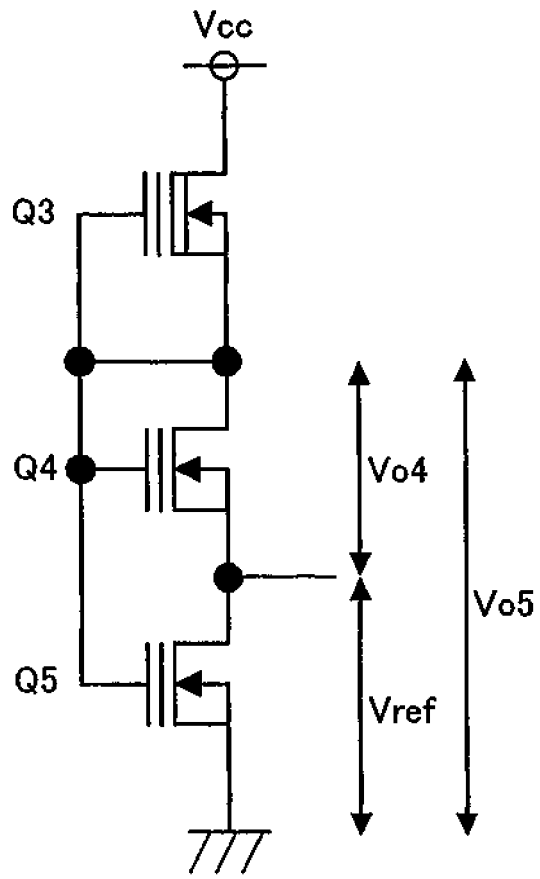
FIG. 4A is a circuit diagram illustrating a second exemplary reference voltage generating circuit according to another embodiment of the present invention.
Figure 4B:
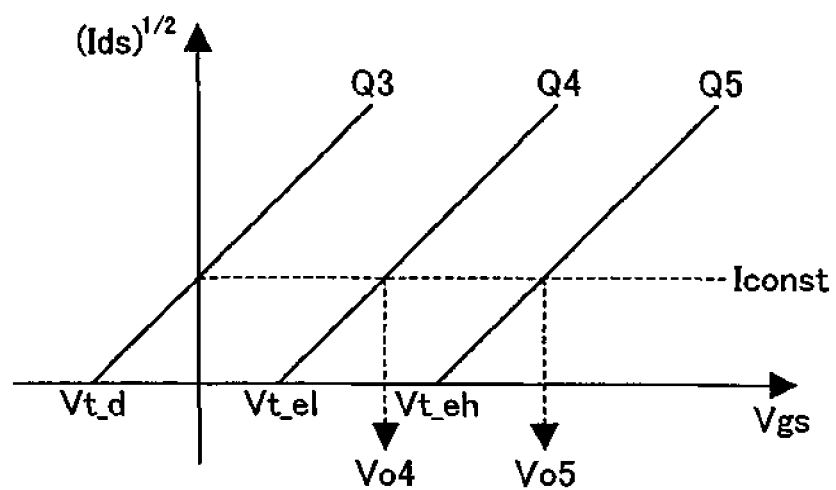
FIG. 4B is a graph showing the relationship between Vgs and $(Ids)^{1/2}$ of MOSFETs in the second exemplary reference voltage generating circuit.

FIG. 4A is a circuit diagram illustrating a second exemplary reference voltage generating circuit according to another embodiment of the present invention. FIG. 4B is a graph showing the relationship between Vgs and (Ids)$^{1/2}$ of MOSFETs in the second exemplary reference voltage generating circuit (on the assumption that the drain voltage is in the saturation region).

MOSFETs Q3, Q4, and Q5 are N-channel MOSFETs each having a floating gate and a control gate. The MOSFETs Q3, Q4, and Q5 have substantially the same channel profile. This means either channel doping is not performed on the MOSFETs Q3, Q4, and Q5, or the channel doping levels of the MOSFETs Q3, Q4, and Q5 are substantially the same. Also, the thicknesses of the gate insulating films, the channel lengths, and the channel widths of the MOSFETs Q3, Q4, and Q5 are substantially the same. In other words, the MOSFETs Q3, Q4, and Q5 have substantially the same structure.

The gate and the source of the MOSFET Q3 are connected, and its drain is connected to a power supply (Vcc). The MOSFETs Q4 and Q5 are connected in series and the gates of the MOSFETs Q4 and Q5 are connected to the drain of the MOSFET Q4. The drain of the MOSFET Q4 is connected to the source of the MOSFET Q3. The source of the MOSFET Q5 is grounded.

The MOSFETs Q3, Q4, and Q5 have an enhancement-mode threshold voltage as the initial threshold voltage. The MOSFET Q3 is configured as a depletion-mode MOSFET by injecting holes. The MOSFET Q4 is configured as an enhancement-mode MOSFET having a threshold voltage lower than the initial threshold voltage by injecting holes. The MOSFET Q5 is configured as an enhancement-mode MOSFET having a threshold voltage higher than that of the MOSFET Q4 by injecting holes. The number of holes injected into the MOSFET Q5 is smaller than that injected into the MOSFET Q4.

FIG. 4B shows the relationship between Vgs and (Ids)$^{1/2}$ of the MOSFETs Q3, Q4, and Q5 (on the assumption that the drain voltage is in the saturation region). Since Vgs of the MOSFET Q3 is fixed at 0 V, the MOSFET Q3 conducts a constant current Iconst. Vo4 is a Vgs of the MOSFET Q4 when Ids=Iconst, and Vo5 is a Vgs of the MOSFET Q5 when Ids=Iconst. The reference voltage Vref can be obtained as the difference between Vo5 and Vo4 (Vo5–Vo4).

Thus, as in the case of the first exemplary reference voltage generating circuit including two MOSFETs as shown in FIG. 2, the above embodiment makes it possible to determine the threshold voltages of the MOSFETs Q3, Q4, and Q5 by injecting holes into the floating gates and thereby makes it possible to obtain a desired reference voltage.

In the above embodiment, each of the MOSFETs Q3, Q4, and Q5 includes a floating gate. However, a configuration where only one of three MOSFETs includes a floating gate is also possible. In this case, the floating gate in one of the three MOSFETs is made hole-rich. For example, the one of the three MOSFETs may be a depletion-mode N-channel MOSFET having a threshold voltage that is attained by lowering a depletion-mode initial threshold voltage by injecting holes.

Figure 5B:
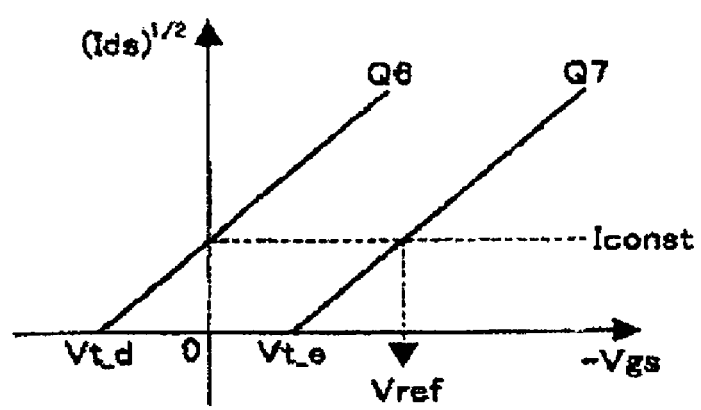
FIG. 5B is a graph showing the relationship between Vgs and $(Ids)^{1/2}$ of MOSFETs in the third exemplary reference voltage generating circuit.

FIG. 5A is a circuit diagram illustrating a third exemplary reference voltage generating circuit according to another embodiment of the present invention. FIG. 5B is a graph showing the relationship between Vgs and (Ids)$^{1/2}$ of MOSFETs in the third exemplary reference voltage generating circuit. MOSFETs Q6 and Q7 are P-channel MOSFETs each having a floating gate and a control gate, and have substantially the same structure. Also, the MOSFETs Q6 and Q7 have substantially the same channel profile. This means either channel doping is not performed on the MOSFETs Q6 and Q7, or the channel doping levels of the MOSFETs Q6 and Q7 are substantially the same. The MOSFETs Q6 and Q7 have a depletion-mode threshold voltage of, for example, 0.8 V as the initial threshold voltage.

The MOSFET Q6 is configured as a depletion-mode MOSFET with a threshold voltage of 0.3 V by injecting holes into the floating gate. The gate and the source of the MOSFET Q6 are connected.

The MOSFET Q7 is configured as an enhancement-mode MOSFET with a threshold voltage of –0.8 V by injecting holes into the floating gate. The number of holes injected into the floating gate of the MOSFET Q7 is larger than that injected into the floating gate of the MOSFET Q6. The gate and the drain of the MOSFET Q7 are connected.

The drain of the MOSFET Q6 is connected to a power supply (–Vcc), the source of the MOSFET Q7 is grounded, and the drain of the MOSFET Q7 is connected to the source of the MOSFET Q6. In other words, the MOSFETs Q6 and Q7 are connected in series between a power supply potential and ground potential. With this configuration, the MOSFET Q7 operates with a constant current from the MOSFET Q6 and a voltage appearing at the MOSFET Q7 is output as a reference voltage.

FIG. 5B shows the relationship between Vgs and (Ids)$^{1/2}$ of the MOSFETs Q6 and Q7 (on the assumption that the drain voltage is in the saturation region). Since Vgs of the MOSFET QE is fixed at 0 V, the MOSFET Q6 conducts a constant current Iconst. Therefore, Vref is a Vgs of the MOSFET Q7 at which Ids equals Iconst (Ids=Iconst).

In the above embodiment, each of the MOSFETs Q6 and Q7 includes a floating gate. However, a configuration where only one of two MOSFETs includes a floating gate is also possible. In this case, the floating gate in one of the two MOSFETs is made hole-rich. For example, the one of the two MOSFETs may be an enhancement-mode P-channel MOSFET having a threshold voltage that is attained by increasing an enhancement-mode initial threshold voltage by injecting holes.

Figure 6A:
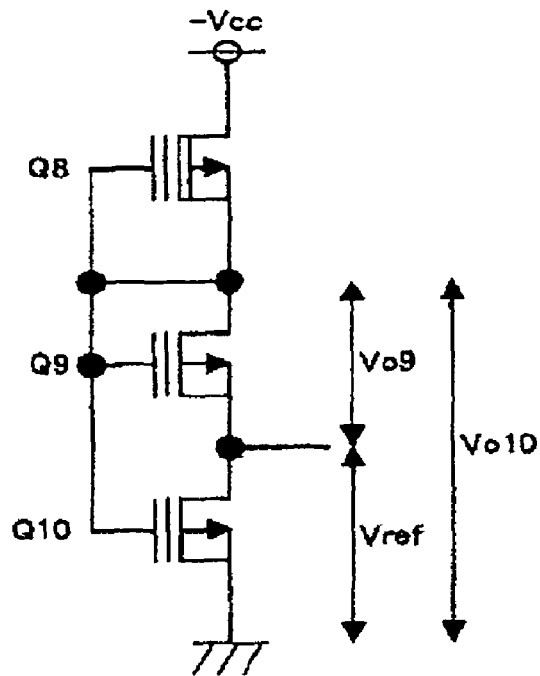
FIG. 6A is a circuit diagram illustrating a fourth exemplary reference voltage generating circuit according to another embodiment of the present invention.
Figure 6B:
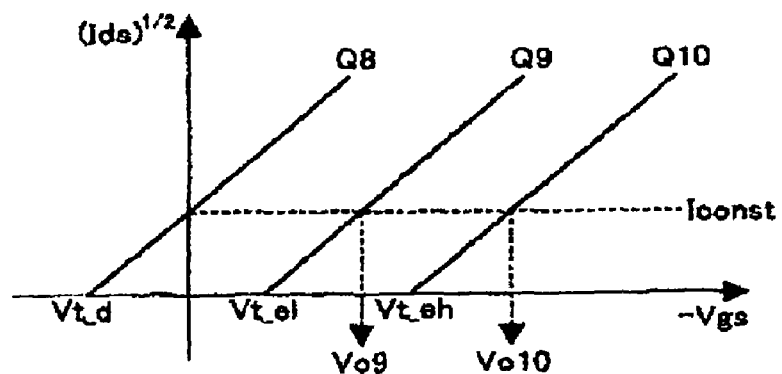
FIG. 6B is a graph showing the relationship between Vgs and $(Ids)^{1/2}$ of MOSFETs in the fourth exemplary reference voltage generating circuit.

FIG. 6A is a circuit diagram illustrating a fourth exemplary reference voltage generating circuit according to another embodiment of the present invention. FIG. 6B is a graph showing the relationship between Vgs and (Ids)$^{1/2}$ of MOSFETs in the fourth exemplary reference voltage generating circuit (on the assumption that the drain voltage is in the saturation region). MOSFETs Q8, Q9, and Q10 are P-channel MOSFETs each having a floating gate and a control gate. The MOSFETs Q8, Q9, and Q10 have substantially the same channel profile. This means either channel doping is not performed on the MOSFETs Q8, Q9, and Q10, or the channel doping levels of the MOSFETs Q8, Q9, and Q10 are substantially the same. Also, the thicknesses of the gate insulating films, the channel lengths, and the channel widths of the MOSFETs Q8, Q9, and Q10 are substantially the same. In other words, the MOSFETs Q8, Q9, and Q10 have substantially the same structure.

The gate and the source of the MOSFET Q8 are connected, and its drain is connected to a power supply (–Vcc). The MOSFETs Q9 and Q10 are connected in series and the gates of the MOSFETs Q9 and Q10 are connected to the drain of the MOSFET Q9. The drain of the MOSFET Q9 is connected to the source of the MOSFET Q8. The source of the MOSFET Q10 is grounded.

The MOSFETs Q8, Q9, and Q10 have a depletion-mode threshold voltage as the initial threshold voltage. The MOSFET Q8 is configured as a depletion-mode MOSFET having a threshold voltage higher than the initial threshold voltage by injecting holes. The MOSFET Q9 is configured as an enhancement-mode MOSFET by injecting holes. The MOSFET Q10 is configured as an enhancement-mode MOSFET having a threshold voltage higher than that of the MOSFET Q9 by injecting holes. The number of holes injected into the MOSFET Q10 is larger than that injected into the MOSFET Q9.

FIG. 6B shows the relationship between Vgs and $(Ids)^{1/2}$ of the MOSFETs Q8, Q9, and Q10 (on the assumption that the drain voltage is in the saturation region). Since Vgs of the MOSFET Q8 is fixed at 0 V, the MOSFET Q8 conducts a constant current Iconst. Vo9 is a Vgs of the MOSFET Q9 when Ids=Iconst and Vo10 is a Vgs of the MOSFET Q10 when Ids=Iconst. The reference voltage Vref can be obtained as the difference between Vo10 and Vo9 (Vo10–Vo9).

This above embodiment makes it possible to determine the threshold voltages of the MOSFETs Q8, Q9, and Q10 by injecting holes into the floating gates and thereby to obtain a desired reference voltage Vref.

In the above embodiment, each of the MOSFETs Q8, Q9, and Q10 includes a floating gate. However, a configuration where only one of three MOSFETs includes a floating gate is also possible. In this case, the floating gate in one of the three MOSFETs is made hole-rich. For example, the one of the three MOSFETs may be an enhancement-mode P-channel MOSFET having a threshold voltage that is attained by increasing an enhancement-mode initial threshold voltage by injecting holes (the absolute value of the current threshold voltage is higher than the initial threshold voltage).

In the embodiments described above, it is assumed that the source and the substrate of each MOSFET are connected. However, the substrate may be connected to a common ground.

Figure 7:
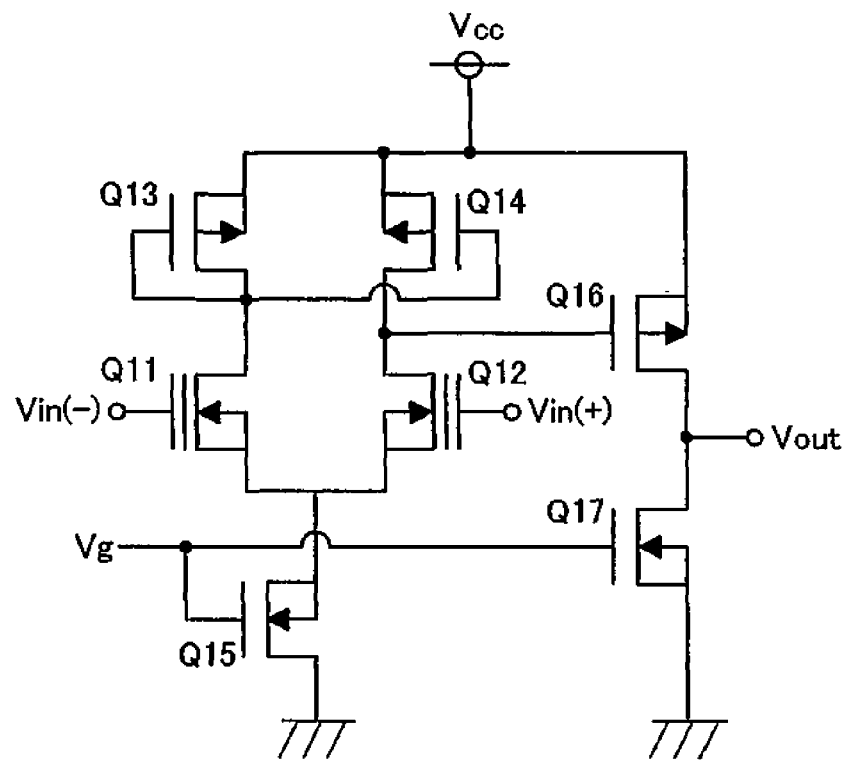
FIG. 7 is a circuit diagram illustrating a fifth exemplary reference voltage generating circuit according to still another embodiment of the present invention.
Figure 8:
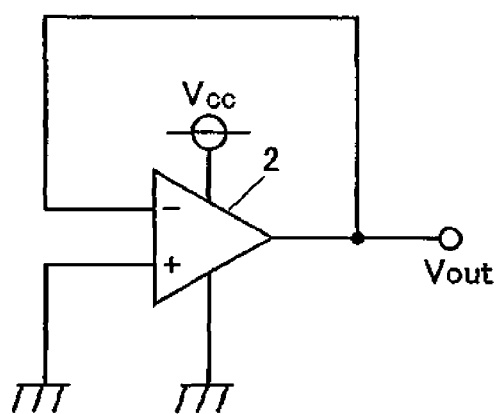
FIG. 8 is a simplified circuit diagram illustrating the fifth exemplary reference voltage generating circuit.

FIG. 7 is a circuit diagram illustrating a fifth exemplary reference voltage generating circuit according to still another embodiment of the present invention. FIG. 8 is a simplified circuit diagram illustrating the fifth exemplary reference voltage generating circuit shown in FIG. 7.

The fifth exemplary reference voltage generating circuit is implemented as an operational amplifier 2 including a differential input stage made up of a pair of N-channel MOSFETs Q11 and Q12. The MOSFETs Q11 and Q12 include a floating gate for each and have substantially the same structure. Also, the MOSFETs Q11 and Q12 have substantially the same channel profile. This means either channel doping is not performed on the MOSFETs Q11 and Q12, or the channel doping levels of the MOSFETs Q11 and Q12 are substantially the same.

The MOSFETs Q11 and Q12 have an enhancement-mode threshold voltage of, for example, 0.8 V as the initial threshold voltage. The threshold voltage of the MOSFET Q11 is, for example, set at −0.3 V by injecting holes into the floating gate. The threshold voltage of the MOSFET Q12 is, for example, set at 0.3 V by injecting holes into the floating gate. The number of holes injected into the floating gate of the MOSFET Q12 is smaller than that injected into the floating gate of the MOSFET Q11.

Q13 and Q14 are load transistors made of P-channel MOSFETs and form a current mirror circuit. Q15 is, for example, a constant current source made of an N-channel MOSFET.

The MOSFETs Q11 through Q15 form a differential amplifier circuit. The gate electrode of the MOSFET Q11 functions as an inverting input terminal (−) and the gate electrode of the MOSFET Q12 functions as a non-inverting input terminal (+).

MOSFETs Q16 and Q17 form a level shift stage. For example, the MOSFET Q16 is made of a P-channel MOSFET and the MOSFET Q17 is made of an N-channel MOSFET. An output signal from the differential amplifier circuit is output to the outside via the level shift stage.

In this embodiment, as shown in FIG. 8, the output terminal of the operational amplifier 2 is connected to the inverting input terminal (−) to provide a negative feedback and the non-inverting input terminal (+) is grounded. In other words, the operational amplifier 2 is configured as a source follower. The non-inverting input terminal (+) may be connected to a reference potential other than ground.

In the fifth exemplary reference voltage generating circuit, each of the MOSFETs Q11 and Q12 constituting the differential input stage includes a floating gate. The MOSFETs Q11 and Q12 are configured to have different threshold voltages by injecting holes. The different threshold voltages generate an offset voltage in the operational amplifier 2. When the threshold voltages of the MOSFETs Q11 and Q12 are Vth1 and Vth2, respectively, an offset voltage Vos is expressed by the following formula:

absolute value of $Vos=|Vth1-Vth2|$

When the operational amplifier 2 is configured as a source follower as shown in FIG. 8, the offset voltage Vos is output from the output terminal as the reference voltage Vref with reference to ground potential to which the non-inverting input terminal (+) is connected.

As described above, according to this embodiment, the floating gates of the MOSFETs Q11 and Q12 are made hole-rich. This configuration makes it possible to improve the retention characteristics of the MOSFETs Q11 and Q12 and thereby to reduce the change over time in the threshold voltages of the MOSFETs Q11 and Q12. This, in turn, makes it possible to reduce the change over time in the reference voltage Vref to be output.

Also, according to this embodiment, each of the MOSFETs Q11 and Q12 includes a floating gate and a control gate. This configuration makes it possible to determine the threshold voltages of the MOSFETs Q11 and Q12 by injecting holes into the floating gates and thereby to obtain a desired reference voltage Vref. In other words, this embodiment eliminates the need to determine the threshold voltage of a MOSFET by ion implantation during wafer processing as in the case of a conventional technology.

Further, this embodiment makes it possible to make the configurations, including the channel profiles, of the MOSFETs Q11 and Q12 substantially the same. This, in turn, reduces the wafer processing variation and the variation in temperature characteristics of MOSFETs and thereby makes it possible to provide a reference voltage generating circuit that can output a stable reference voltage.

In the fifth exemplary reference voltage generating circuit shown in FIGS. 7 and 8, N-channel MOSFETs are used as the MOSFETs Q11 and Q12 constituting the differential input stage. However, P-channel MOSFETs may be used instead of N-channel MOSFETs to form a differential input stage.

In the above embodiment, each of the MOSFETs Q11 and Q12 includes a floating gate. However, a configuration where only one of the MOSFETs Q11 and Q12 includes a floating gate is also possible. In this case, the floating gate in one of the MOSFETs Q11 and Q12 is made hole-rich.

Although both of the floating gates of the MOSFETs Q11 and Q12 are made hole-rich in the above embodiment, a configuration where one of the floating gates is made hole-rich and the other one is discharged by ultraviolet irradiation is also possible.

Figure 9:
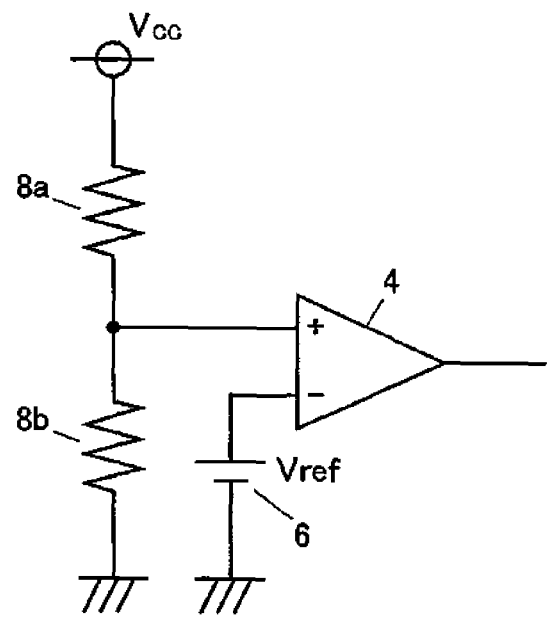
FIG. 9 is a circuit diagram illustrating an exemplary power supply device according to an embodiment of the present invention.

FIG. 9 is a circuit diagram illustrating an exemplary power supply device including a reference voltage generating circuit according to an embodiment of the present invention. The exemplary power supply device is used, for example, in a mobile phone or other mobile devices and includes a detection circuit that detects the drop or rise of a power supply voltage Vcc by comparing the power supply voltage Vcc with a reference voltage Vref. FIG. 9 shows an exemplary detection circuit in the exemplary power supply device.

In FIG. 9, 4 indicates an operational amplifier. A reference voltage generating circuit 6 connected to the inverting input terminal (−) of the operational amplifier 4 provides a reference voltage Vref. A power supply voltage from a battery used as a power supply is applied to a power supply terminal Vcc. The power supply voltage is reduced by voltage dividing resistors 8a and 8b and the reduced voltage is supplied to the non-inverting input terminal (+) of the operational amplifier 4.

The reference voltage generating circuit 6 is configured, for example, according to one of the embodiments described above and is supplied with a power supply voltage Vcc from the battery.

The operational amplifier 4, the reference voltage generating circuit 6, and the voltage dividing resistors 8a and 8b form the exemplary detection circuit.

In the exemplary power supply device, when the power supply voltage of the battery is high and the reduced voltage is higher than the reference voltage Vref, the output signal from the operational amplifier 4 becomes high; and when the power supply voltage of the battery drops and the reduced voltage becomes equal to or lower than the reference voltage Vref, the output signal from the operational amplifier 4 becomes low. The output signal from the operational amplifier may be used, for example, to display a message on a mobile device such as a mobile phone to report that the power supply voltage of the battery is lower than a predetermined level. In this case, it is necessary for the reference voltage generating circuit 6 to generate a stable reference voltage Vref without being influenced by, for example, temperature change. A reference voltage generating circuit according to an embodiment of the present invention is able to generate a stable reference voltage without being influenced by temperature change.

Also, a power supply device may include multiple detection circuits using different reference voltages Vref or having voltage dividing resistors 8a and 8b with different voltage dividing ratios. In this case, the multiple detection circuits detect different voltage levels and thereby make it possible to detect the change in the voltage level of a battery more precisely.

Figure 10:
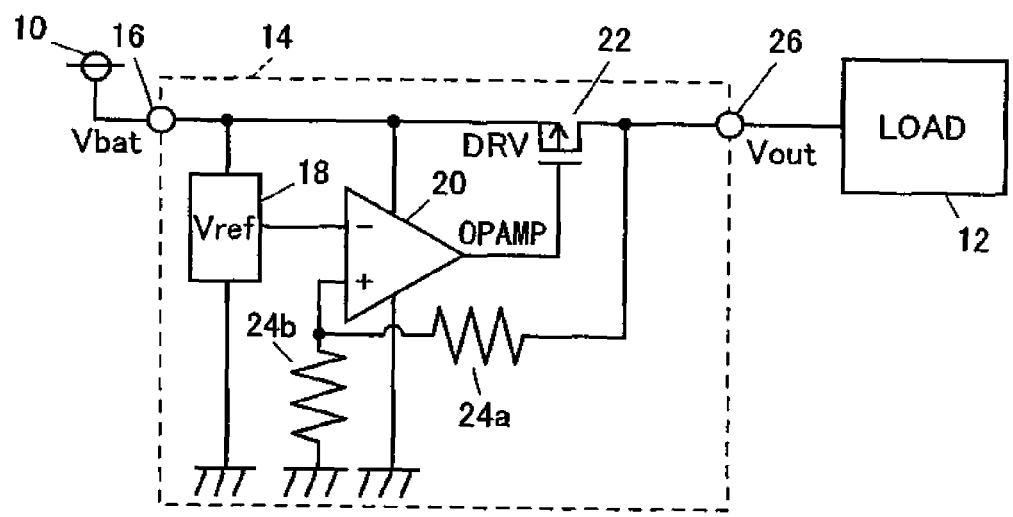
FIG. 10 is a circuit diagram illustrating another exemplary power supply device according to an embodiment of the present invention.

FIG. 10 is a circuit diagram illustrating an exemplary constant-voltage power supply device including a reference voltage generating circuit according to an embodiment of the present invention. A constant-voltage circuit 14 regulates a power supply voltage from a power supply 10 and supplies a constant voltage to a load 12. The constant-voltage circuit 14 includes an input terminal (Vbat) 16 to which the power supply 10 is connected, a reference voltage generating circuit (Vref) 18, an operational amplifier (OPAMP) 20, an output transistor (DRV) 22 including P-channel MOSEETs, voltage dividing resistors 24a and 24b, and an output terminal (Vout) 26.

In the constant-voltage circuit 14, the output terminal of the operational amplifier 20 is connected to the gate terminal of the output transistor 22, a reference voltage Vref from the reference voltage generating circuit 18 is applied to the inverting input terminal (−) of the operational amplifier 20, and a reduced voltage obtained by reducing an output voltage Vout by the voltage dividing resistors 24a and 24b is applied to the non-inverting input terminal (+) of the operational amplifier 20. In other words, the constant-voltage circuit 14 is configured to control the output voltage Vout so that the reduced voltage matches the reference voltage Vref.

Thus, the reference voltage generating circuit 18 according to an embodiment of the present invention provides a stable reference voltage Vref and thereby makes it possible for the constant-voltage circuit 14 to supply a stable output voltage Vout.

According to an embodiment of the present invention, a reference voltage generating circuit includes two or more MOSFETs connected to each other and a reference voltage is generated by the difference between the threshold voltages of the MOSFETs. At least one of the two or more MOSFETs includes a floating gate and a control gate, and the floating gate(s) is made hole-rich or discharged by ultraviolet irradiation. This configuration makes it possible to improve the retention characteristics (charge retention characteristics) of MOSFETs and thereby to reduce the change over time in the threshold voltages of the MOSFETs. This, in turn, makes it possible to reduce the change over time in the reference voltage Vref to be output.

Also, using a MOSFET including a floating gate and a control gate makes it possible to determine the threshold voltage of the MOSFET by the number of holes injected into its floating gate. In other words, the threshold voltage of the MOSFET can be changed after manufacturing. This makes it possible to reduce the time necessary to manufacture a device after the reference voltage level is determined.

According to an embodiment of the present invention, a reference voltage generating circuit includes two or more MOSFETs connected to each other. Each of the two or more MOSFETs includes a floating gate and a control gate, and the floating gate is made hole-rich or discharged by ultraviolet irradiation. With this configuration, all of the MOSFETs show substantially the same characteristics in terms of change over time in the threshold voltage. In other words, the difference between the threshold voltages of the MOSFETs is substantially the same over time. This, in turn, makes it possible to reduce the change over time in the reference voltage Vref. Also, this configuration makes it possible to reduce the variation in initial threshold voltage of the MOSFETs by injecting holes into the floating gates and thereby to provide a high-precision reference voltage generating circuit.

According to an embodiment of the present invention, a reference voltage generating circuit includes two or more MOSFETs having substantially the same structure. Each of the two or more MOSFETs includes a floating gate and a control gate, and the floating gate of at least one of the two or more MOSFETs is discharged by ultraviolet irradiation.

According to an embodiment of the present invention, a reference voltage generating circuit includes MOSFETS. When two or more of the MOSFETs include floating gates, the floating gates may be configured in one of the following ways: all of the floating gates are made hole-rich; one or more of the floating gates are made hole-rich and the rest of the floating gates are discharged by ultraviolet irradiation; and all of the floating gates are discharged by ultraviolet irradiation.

According to an embodiment of the present invention, a reference voltage generating circuit includes two or more MOSFETs each including a floating gate and a control gate and having substantially the same channel doping level. This configuration makes it possible to reduce wafer processing variations and temperature dependence of MOSFETs and thereby to provide a high-precision and stable reference voltage generating circuit.

According to an embodiment of the present invention, a reference voltage generating circuit includes two or more N-channel MOSFETs having an enhancement-mode initial threshold voltage. With this configuration, each of the N-channel MOSFETs can be configured either as an enhancement-mode MOSFET or a depletion-mode MOSFET by injecting holes.

According to an embodiment of the present invention, a reference voltage generating circuit includes two or more P-channel MOSFETs having a depletion-mode threshold voltage as the initial threshold voltage. With this configuration, each of the P-channel MOSFETs can be configured either as an enhancement-mode MOSFET or a depletion-mode MOSFET by injecting holes.

According to an embodiment of the present invention, a reference voltage generating circuit includes two or more MOSFETs connected in series and at least one of the MOSFETs is a depletion-mode MOSFET. The gate and the source of the depletion-mode MOSFET are connected to supply a constant current. With this configuration, a reference voltage can be output from a connecting point between the MOSFETs.

According to an embodiment of the present invention, a reference voltage generating circuit is implemented as an operational amplifier including a differential input stage made up of two MOSFETs connected to each other. The output terminal of the operational amplifier is connected to its inverting input terminal. With this configuration, an offset voltage or a reference voltage can be output by using the difference between the threshold voltages of the MOSFETs.

Still another embodiment of the present invention provides a power supply device including a detection circuit that detects the drop or rise of a power supply voltage by comparing the power supply voltage with a reference voltage. The detection circuit includes a reference voltage generating circuit according to an embodiment of the present invention that generates the reference voltage. A power supply device with the above configuration can accurately detect the drop or rise of a power supply voltage.

The present invention is not limited to the specifically disclosed embodiments, and variations and modifications may be made without departing from the scope of the present invention.

For example, in a reference voltage generating circuit according to the above embodiments, two or more MOSFETs having substantially the same configuration are connected to each other to generate a reference voltage by the difference between the threshold voltages of the MOSFETs. However, the MOSFETs may have different configurations in terms of channel profiles, thicknesses of gate insulating films, channel lengths, channel widths, materials, and so on.

Also, either P-channel MOSFETs or N-channel MOSFETs are used in a reference voltage generating circuit according to the above embodiments. However, a combination of a P-channel MOSFET(s) and an N-channel MOSFET(s) may also be possible.

Further, a reference voltage generating circuit according to the present invention may also be applied to devices other than a power supply device.

The present application is based on Japanese Priority Application No. 2006-096672 filed on Mar. 31, 2006 and Japanese Priority Application No. 2006-301070 filed on Nov. 7, 2006, the entire contents of which are hereby incorporated herein by reference.

The invention claimed is:

1. A reference voltage generating circuit for generating a reference voltage, comprising:
 at least a pair of MOSFETs connected to each other; wherein
 only one of the pair of MOSFETs includes a control gate and a floating gate;
 holes are injected into the floating gate of the one of the pair of MOSFETs; and
 the reference voltage generating circuit is configured to output a difference between threshold voltages of the pair of MOSFETs as the reference voltage,
 wherein the pair of MOSFETs are P-channel MOSFETs each having a depletion-mode threshold voltage as an initial threshold voltage.

2. A power supply device, comprising:
 the reference voltage generating circuit as claimed in claim 1; and
 a detection circuit configured to detect a change in a power supply voltage by comparing the power supply voltage with the reference voltage supplied from the reference voltage generating circuit.

3. A power supply device, comprising:
 a reference voltage generating circuit for generating a reference voltage, said reference voltage generating circuit comprising:
 at least a pair of MOSFETs connected to each other, wherein
 only one of the pair of MOSFETs includes a control gate and a floating gate,
 holes are injected into the floating gate of the one of the pair of MOSFETs, and
 the reference voltage generating circuit is configured to output a difference between threshold voltages of the pair of MOSFETs as the reference voltage; and
 a detection circuit configured to detect a change in a power supply voltage by comparing the power supply voltage with the reference voltage supplied from the reference voltage generating circuit.

* * * * *